United States Patent
Chuang

(10) Patent No.: US 6,724,250 B2
(45) Date of Patent: Apr. 20, 2004

(54) TRANSFORMER OF POWER-AMPLIFIER MODULE FOR AN AUDIO DEVICE

(76) Inventor: Pao-An Chuang, 12F-2, No.376,Tun Hwa South Rd., Sec. 1, Taipei (TW)

( * ) Notice: Subject to any disclaimer, the term of this patent is extended or adjusted under 35 U.S.C. 154(b) by 6 days.

(21) Appl. No.: 10/166,672

(22) Filed: Jun. 12, 2002

(65) Prior Publication Data

US 2003/0231056 A1 Dec. 18, 2003

(51) Int. Cl.⁷ .................................. H03F 1/00
(52) U.S. Cl. ........................... 330/65; 330/165
(58) Field of Search .................. 330/65, 66, 68, 330/165; 381/104, 120

(56) References Cited

U.S. PATENT DOCUMENTS 5,164,991 A * 11/1992 Johnson et al. ............. 381/120
6,005,950 A * 12/1999 Cuniberti ................. 381/118 X

* cited by examiner

Primary Examiner—Steven J. Mottola
(74) Attorney, Agent, or Firm—Troxell Law Office PLLC

(57) ABSTRACT

A transformer of power-amplifier module for an audio device includes a casing having a first plug and a second plug formed thereon. In the casing, there is an amplifying circuit having an input electrically connected to the first plug and an output electrically connected to the second plug of the casing. The amplifying circuit terminates in a transformer at the output. Furthermore, the transformer is adjustable so as to control the amplitude of output voltage of the transformer of power-amplifier module.

6 Claims, 8 Drawing Sheets

Prior Art Fig.1

$$\boxed{1:1} * \boxed{1:1} = 1$$

$$\boxed{1:1} * \boxed{1:2} = 2$$

$$\boxed{1:1} * \boxed{1:3} = 3$$

$$\boxed{1:2} * \boxed{1:2} = 4$$

$$\boxed{1:2} * \boxed{1:3} = 6$$

$$\boxed{1:3} * \boxed{1:3} = 9$$

Fig. 5

TRANSFORMER OF POWER-AMPLIFIER MODULE FOR AN AUDIO DEVICE

BACKGROUND OF THE INVENTION

1. Field of the Invention

The present invention relates to a transformer of power-amplifier module for an audio device and, more particularly, to a transformer of power-amplifier module whose inputs and outputs are controlled by magnetic coupling to achieve broadband transmission and is suitable for apply in amplifier of audio equipments or other similar ones.

2. Description of Prior Art

It is well known that using electron tubes is the best way to have amplifier of audio equipments a rich voice. But the amplifier of electron tubes is by valves such that the load speaker wording in 4~8 will be in the high voltage status. Consequently it is difficult to insulate, hard to keep in good repair at high energy consume and low power with around 3000 to 5000 hrs life-span, and expensive in manufacturing cost that it is not easy to.

Amplifiers adjusted with variable transistors are widely used now. It is found in any audio device that these amplifiers, particular power-amplifiers, are connected sequentially in a resistance-capacitance coupled manner and that a variable resistor is used to adjust loudness of an audio. These result in cheaper manufacturing cost but may lose tone quality. However to raise the tone quality it is necessary to use electronic tubes and there is no other choice up to now. Actually for some expensive audios it is indispensable to raise their acoustics. Besides, the output of an audio through loudspeakers with different sensitivities should collocate with suitable thrust or the sound will not harmonize.

The components used in the audio circuit in current is of fixed type which is a circuit composed of one or more transistors connected in push-pull form. The selection and distribution of components were well planned while designing the board and after the electronic circuit has been set up the function and range of signal administration has been limited, such that there is no maneuver variation in amplification power and of course its acoustics can not adjust suitably with different loudspeakers. In addition, this design of whole board will occupy more space in casing fabrication because of its outward appearance has been fixed.

Therefore, the motive of the present invention is to improve those shortcomings of the prior arts and to provide a transformer of power-amplifier module for an audio device whose volume can be controlled by magnetic coupling and can be connected in series for loudspeakers with different sensitivities.

SUMMARY OF THE INVENTION

The object of the present invention is to provide a transformer of power-amplifier module, which organizes the amplification circuits to control the volume.

Another object of the present invention is to provide a transformer of power-amplifier module that several transformer of power-amplifier modules of different amplification ratios can used in series connection to collocate with loudspeakers with different sensitivities.

To accomplish the objects above, the transformer of power-amplifier module in the present invention is mainly comprised of a casing, in which an amplifying circuit regulated by a magnetic coupling is established; there is a first plug, corresponding to the input of the amplifying circuit interior, positioned at one end of the casing; there is a second plug corresponding to the output of the amplifying circuit interior, positioned at another end of the casing; the volume is controlled by modifying the magnetic coupling, and several modules can be used in series connection.

BRIEF DESCRIPTION OF THE DRAWINGS

FIG. 5 is the rates that the transformer of power-amplifier modules for audio devices in the present invention can be configured.

DETAILED DESCRIPTION OF THE PREFERRED EMBODIMENT

Figure 1:
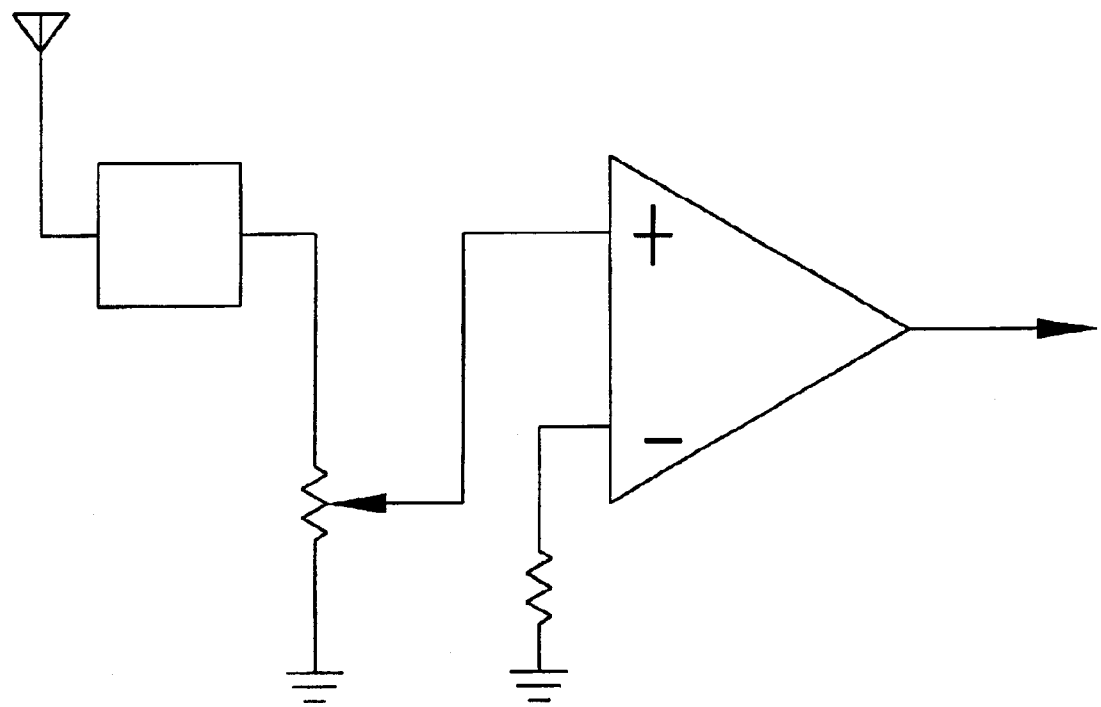
FIG. 1 is a circuit diagram showing a conventional amplifier connected to a variable resistor for adjusting loudness.
Figure 2:
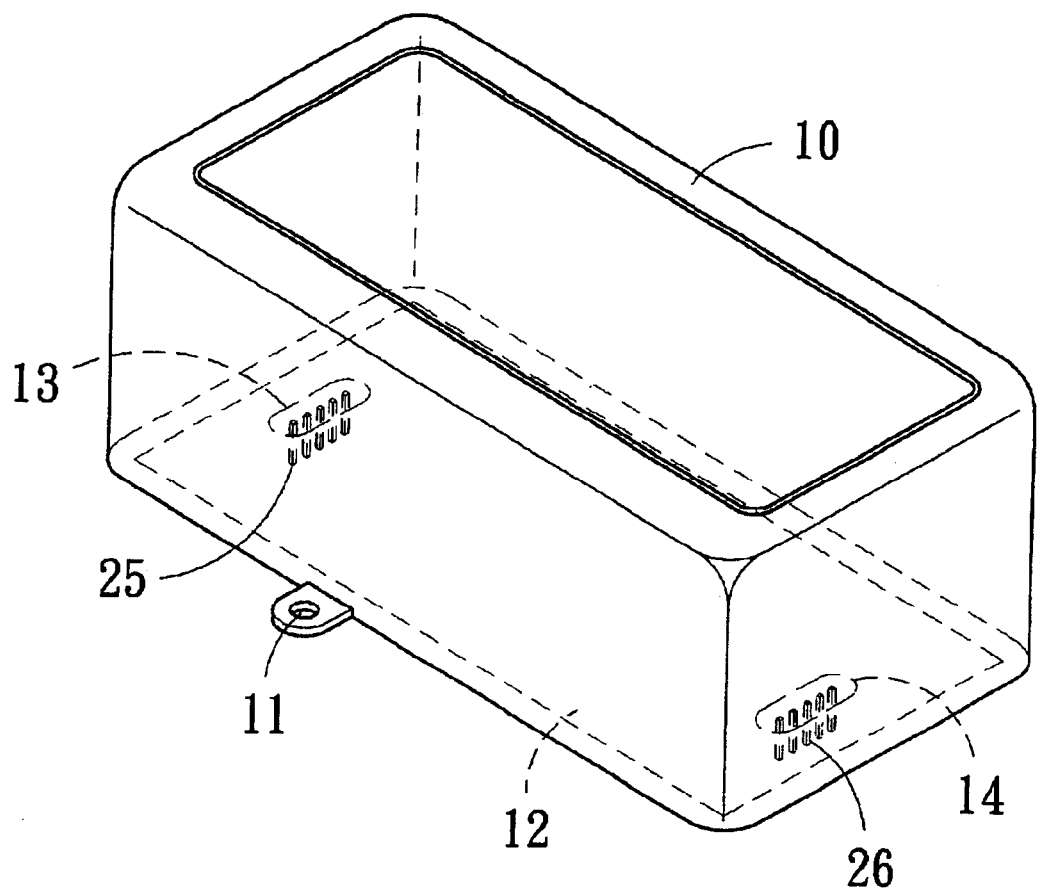
FIG. 2 is a perspective view of an embodiment of the present invention.
Figure 3:
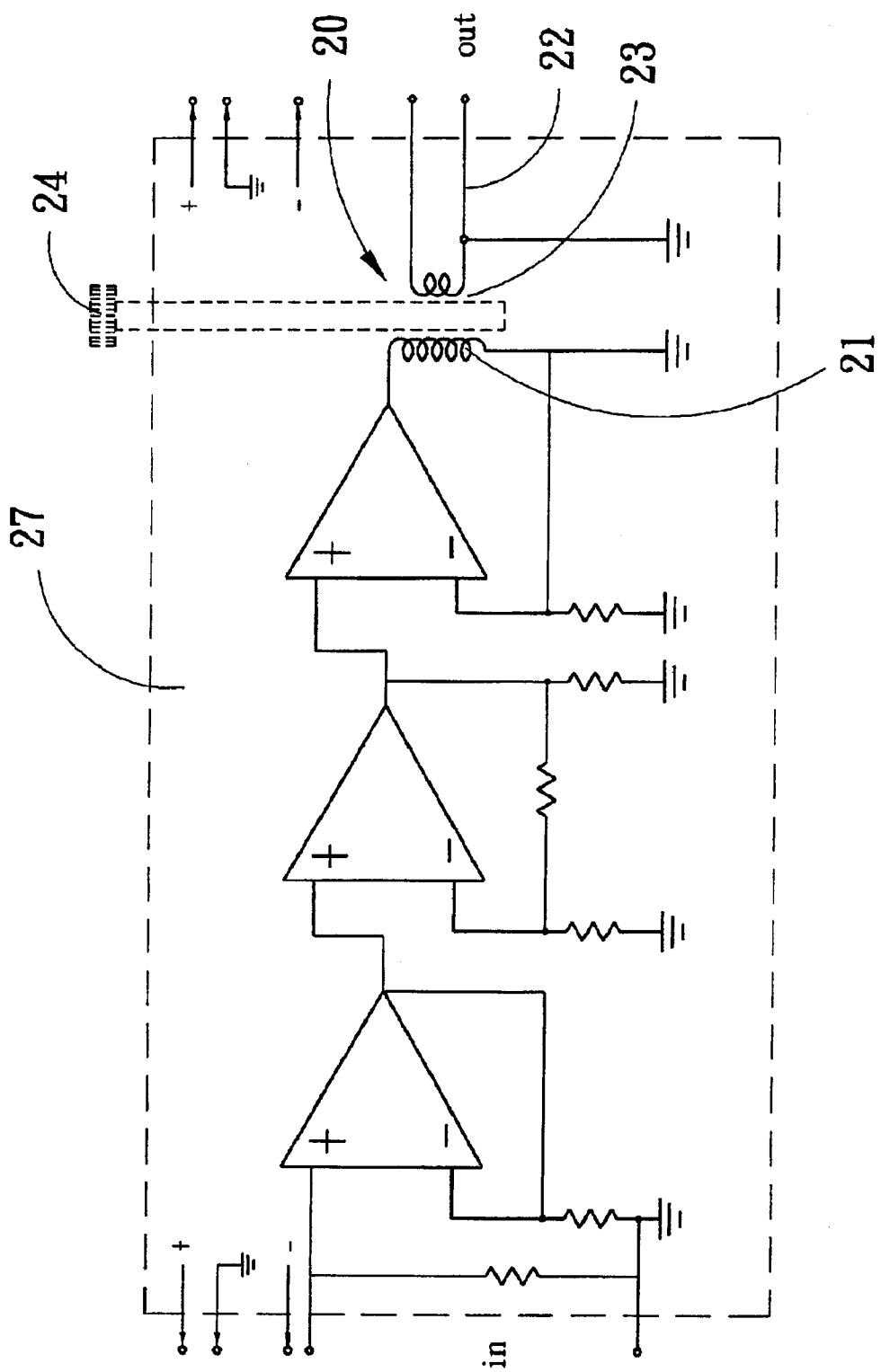
FIG. 3 is a circuit diagram of the magnetic coupling of the present invention.

Referring to FIGS. 2 and 3, there is shown an embodiment of a transformer of power-amplifier module in accordance with the present invention. The transformer of power-amplifier module mainly includes a casing 10, in which an amplifying circuit 27 regulated by a magnetic coupling 20 is established, has a first plug 25 that corresponding to the input of the amplifying circuit 27 and protruding out of the casing 10 through a slot 13 of a bottom lid 12, and has a second plug 26, that corresponding to the output of the amplifying circuit 27 and protruding out of the casing 10 through a slot 14 of the bottom lid 12.

While in use, the casing 10 could be a rectangle one with a unidirectional opening and there are two mounting tabs 11 on both sides of it with the bottom lid 12 for covering. There are two slots 13 and 14 positioned in some appropriate sites of bottom lid 12.

Figure 4:
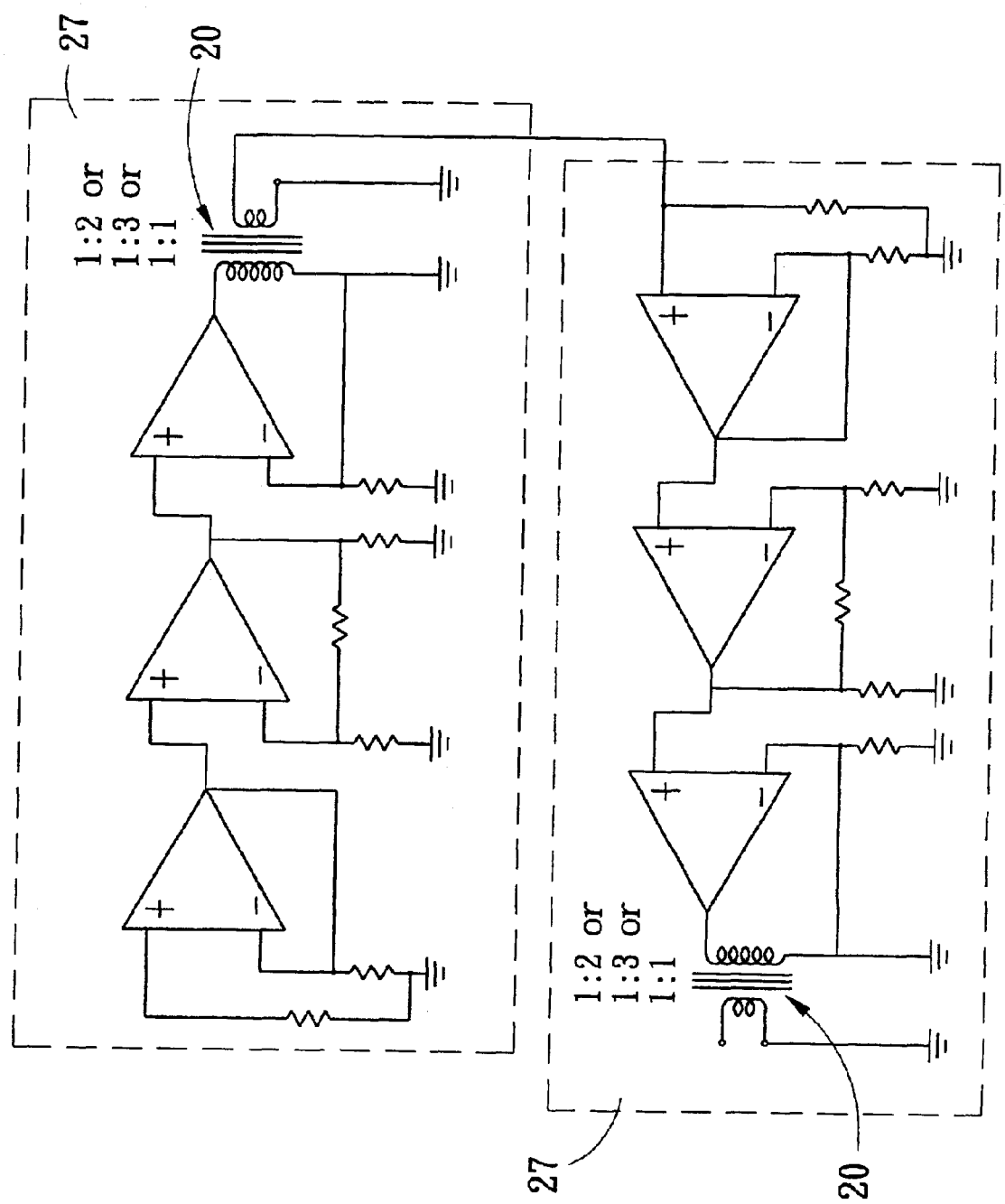
FIG. 4 is a circuit diagram of the magnetic coupling of the present invention configured in module.

Referring to FIGS. 4 and 5, the magnetic coupling 20 is selected so that the amplifying circuit 27, or the transformer of power-amplifier module, may produce an individual current-amplification, e.g. of 1:1, 1:2 or 1:3 from the input to the output. In this manner, two of such module with the same or different individual current-amplification can be connected in series to produce a collective current-amplification, about which 6 possible results are available as listed in FIG. 5.

These collective current-amplifications are used for respective loudspeakers which must be driven with different powers.

Figure 6:
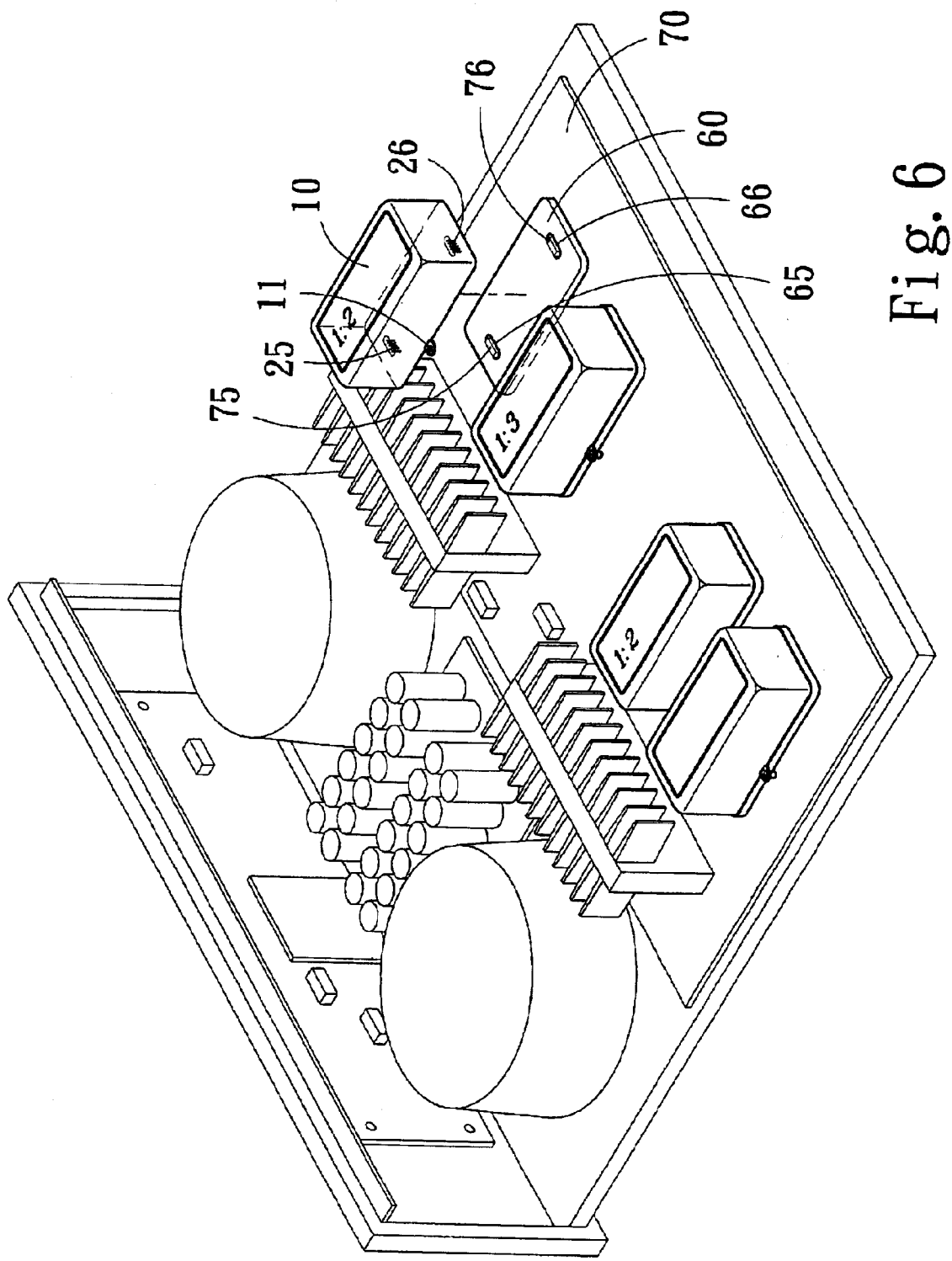
FIG. 6 is a perspective view of an embodiment of the present invention.

Referring to FIG. 6, because the mould having an input and output parts, thereby can be connected in series for use. In use, there is shown an audio device cooperating with the inventive transformer of power-amplifier modules. As illustrated, the instrument includes a simple wired circuit board 70 having pairs of sockets 75 and 76 connected in series for the plugs 25 and 26 of the modules.

These sockets 75 and 76 facilitate the electric connection between the modules, which can be connected to and removed from the circuit board 70 easily. For example, if the original module is a (1:2 and 1:1) size casing 10, when the loudspeaker in the audio device is changed, or if a rich sound effect would like to be achieved, the original module can be removed and replaced by the casing 10 in (1:3 and 1:1) size or in (1:2 and 1:2) size suitable for the substituting loudspeaker. There is no need to replace the whole set of transformer of power-amplifier.

In a highly preferred embodiment, a pad 60 of the same shape of the casing 10 is positioned therein between the casing 10 and circuit board 70. Whereon the opposite sites of the pad 60 having a pair of apertures 65 and 66 from which the plugs 25 and 26 are protruded. The bottom side of the pad 60 is fixed by twin adhesive tape to the circuit board 70 to provide for protect of the plugs 25 and 26 from damage before connection with the sockets 75 and 76 when the casing 10 is not in use as well as for ensuring the pad 60 is fixed firmly on the circuit board 70 to provide an appropriate distance of the casing 10 for the connection of the two plugs 25 and 26 with the sockets 75 and 76 being in a certain height for not too deep or too shallow.

Figure 7:
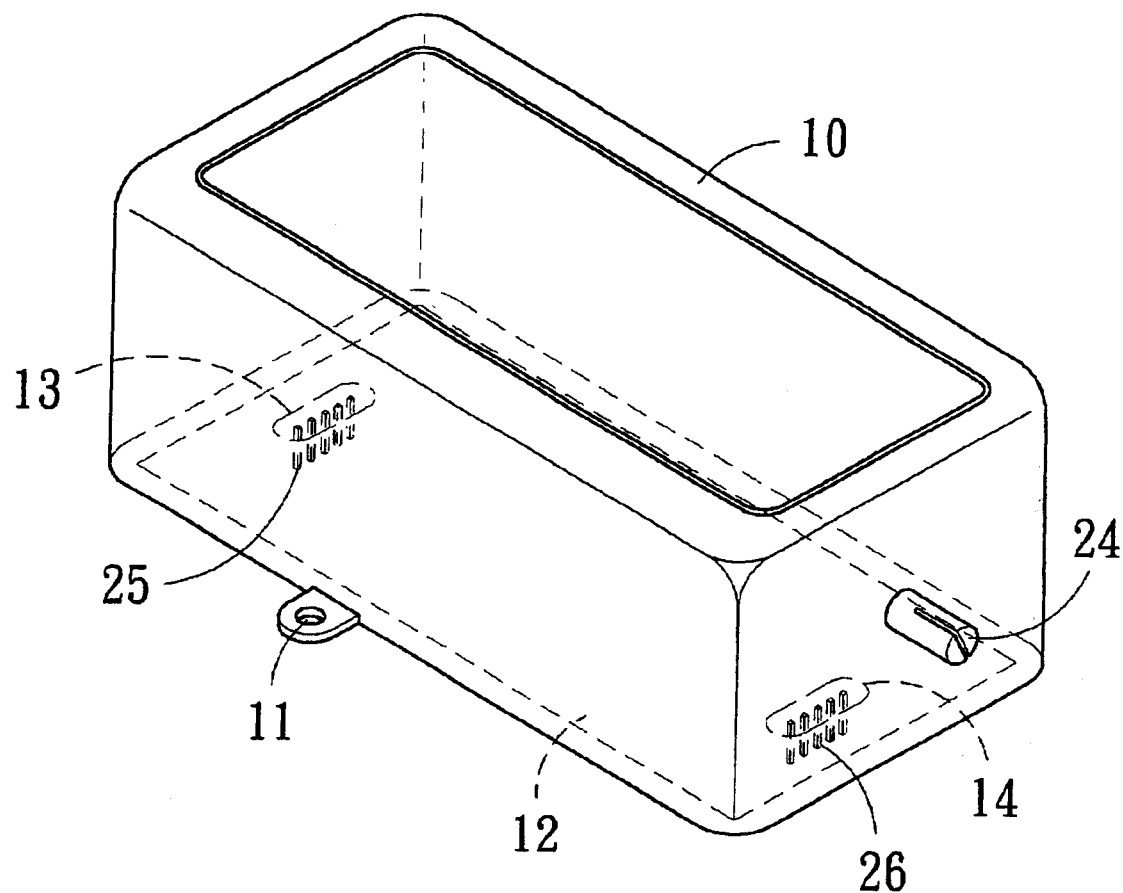
FIG. 7 is a perspective view of a second embodiment of the present invention.

In an alternative embodiment, as shown in FIGS. 3 and 7, the regulator 24 extends out of the casing 10 for easy adjustment of the amplitude of output voltage to achieve the effect of sound volume control.

In detail, the magnetic coupling 20 has a primary coil 21 and a secondary coil 22 both around a regulator 24 of a magnetic substance. When being turned, the regulator 24 is moved relative to the coils 21 and 22 in opposite directions as designated by the double-head arrow, so as to adjust the reluctance in a space 23 within the coils 21, 22 and hence the amplitude of output voltage across the secondary coil 22. In other words, the loudness of a loudspeaker connected to the output can be adjusted by turning the regulator 24.

Figure 8:
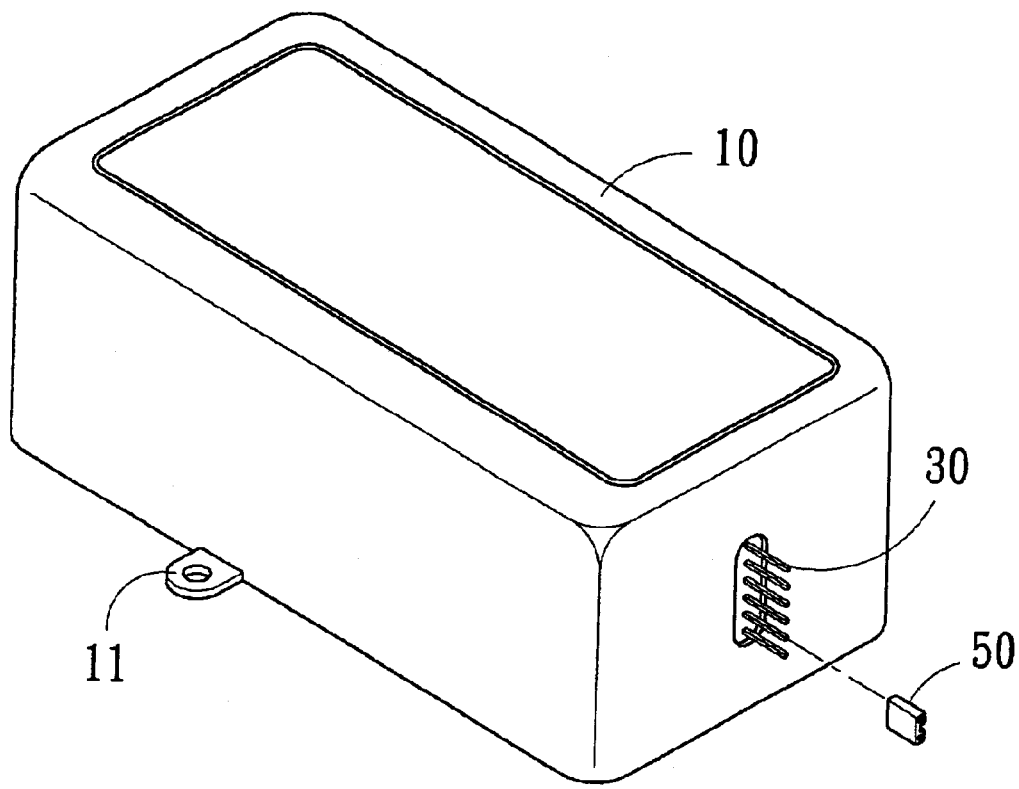
FIG. 8 is a perspective view of a second embodiment of the present invention.

In another embodiment, as shown in FIG. 8, each of the primary coil 21 and the secondary coil 22 of the magnetic coupling 20 is preferably provided with a plurality of pins 30 for corresponding to the varies sizes of the coil and which are extended to the exterior of the casing 10. And with the designing of the pins 30 selectively interconnected by a jumper 50 to change effective turns of the coils 21 and 22 in order to achieve an impedance match between the loudspeaker and the power-amplifying module.

From the foregoing, it is apparent that the present invention has the following advantages:

1. Because of its module design, any of such modules can provide more flexible space planning and be easily replaced by another one to produce a collective current-amplification more suitable for a substituting loudspeaker to provide a best sound effect.
2. This inventive module is designed to be coupled to effectively use the sound sources with low voltage to achieve the results of energy saving, manufacturing cost reducing and further providing voice as rich as an electron-tube amplifier does.
3. By using the regulator or jumper to adjust the magnetic reluctance of the magnetic coupling, the inventive mould can be suitable for apply in amplifier of audio equipments or other similar ones.

While the principles of this invention have been disclosed in connection with specific embodiments, it should be understood by those skilled in the art that these descriptions are not intended to limit the scope of the invention, and that any modification and variation without departing the spirit of the invention is intended to be covered by the scope of this invention defined only by the appended claimed.

What is claimed is:

1. A transformer of power-amplifier module for an audio device, comprising:

a casing having a first plug and a second plug formed thereon; and an amplifying circuit regulated by a magnetic coupling and received in said casing, said amplifying circuit having an input electrically connected to said first plug and an output electrically connected to said second plug of said casing so as to control the amplitude of output voltage of said transformer of power-amplifier module, wherein said casing is configured as a box with two mounting tabs on opposite sides and having one opening and one coordinated bottom lid, and wherein said bottom lid has a first slot and a second slot relative to the first and second plugs, said slots have a plurality of pins, and said magnetic coupling in said case comprises a plurality of individual coil modules co-located with same amplifying ratio in voltage and different amplifying ratio in current.

2. The transformer of power-amplifier module for an audio device of claim 1, wherein said individual coil modules have at least three standards, for example, the amplifying ratio co-located from modules with current amplifying ratio 1:2:3 can be 1, 2, 3, 6, or 9 times.

3. The transformer of power-amplifier module for an audio device of claim 1, further comprising a pad the same size as the bottom lid and having twin adhesive tape on a back, the pad includes a pair of apertures from which said plugs of the magnetic couplings protrude.

4. The transformer of power-amplifier module for an audio device of claim 1, further comprising two coils and a regulator, the regulator is installed in a space between the coils and extends out of said casing for easy adjustment so as to change the magnetic reluctance.

5. The transformer of power-amplifier module for an audio device of claim 1, further comprising two coils, each of said two coils is provided with a plurality of pins and a magnetic reluctance of said two coils is adjusted by setting a jumper.

6. The transformer of power-amplifier module for an audio device of claim 1 wherein said amplifier has a circuit board with a plurality of stages of connectable sockets.

\* \* \* \* \*